(12) United States Patent
Shiokawa et al.

(10) Patent No.: US 11,424,404 B2
(45) Date of Patent: Aug. 23, 2022

(54) FERROMAGNETIC LAMINATED FILM, SPIN CURRENT MAGNETIZATION ROTATING ELEMENT, MAGNETORESISTANCE EFFECT ELEMENT, AND MAGNETIC MEMORY

(71) Applicant: TDK CORPORATION, Tokyo (JP)

(72) Inventors: Yohei Shiokawa, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 192 days.

(21) Appl. No.: 16/956,802

(22) PCT Filed: Feb. 26, 2019

(86) PCT No.: PCT/JP2019/007262
§ 371 (c)(1),
(2) Date: Jun. 22, 2020

(87) PCT Pub. No.: WO2019/167929
PCT Pub. Date: Sep. 6, 2019

(65) Prior Publication Data
US 2020/0321518 A1    Oct. 8, 2020

(30) Foreign Application Priority Data
Feb. 27, 2018  (JP) .............................. JP2018-033101

(51) Int. Cl.
*H01L 21/02* (2006.01)
*H01L 21/00* (2006.01)
(Continued)

(52) U.S. Cl.
CPC ............ *H01L 43/04* (2013.01); *H01L 27/222* (2013.01); *H01L 43/10* (2013.01)

(58) Field of Classification Search
CPC .......................... H01L 27/222; H01F 10/3286
(Continued)

(56) References Cited

U.S. PATENT DOCUMENTS

| | | | |
|---|---|---|---|
| 6,856,494 B2 * | 2/2005 | Ooshima | H01L 43/08 360/324.12 |
| 7,531,882 B2 | 5/2009 | Nguyen et al. | |

(Continued)

FOREIGN PATENT DOCUMENTS

| | | |
|---|---|---|
| JP | 2010-219412 A | 9/2010 |
| JP | 2014-183319 A | 9/2014 |

OTHER PUBLICATIONS

Fukami, S. et al., "A Spin-Orbit Torque Switching Scheme With Collinear Magnetic Easy Axis and Current Configuration", Nature Nanotechnology, Mar. 21, 2016, DOI:10.1038/NNANO.2016.29, pp. 1-6.

(Continued)

*Primary Examiner* — Calvin Lee
(74) *Attorney, Agent, or Firm* — Oliff PLC (57) ABSTRACT

A ferromagnetic laminated film includes a plurality of first magnetic layers, at least one second magnetic layer, and at least one first non-magnetic layer, in which the first magnetic layers are alternately laminated with the second magnetic layer or the first non-magnetic layer, and a material forming the first magnetic layers is different from a material forming the second magnetic layer, and the first magnetic layers, the first non-magnetic layer, and the second magnetic layer are a material combination in which interface magnetic anisotropy is generated between the first magnetic layer and the first non-magnetic layer, and a material combination in which interface magnetic anisotropy is generated between the first magnetic layer and the second magnetic layer.

15 Claims, 6 Drawing Sheets (51) Int. Cl.
*H01L 43/04* (2006.01)
*H01L 27/22* (2006.01)
*H01L 43/10* (2006.01)

(58) Field of Classification Search
USPC ................................. 438/3, 785; 257/295
See application file for complete search history.

(56) References Cited

U.S. PATENT DOCUMENTS

| | | | | |
|---|---|---|---|---|
| 10,164,174 | B2* | 12/2018 | Sato | H01L 43/08 |
| 10,998,491 | B2* | 5/2021 | Watanabe | G11C 11/161 |
| 11,081,641 | B2* | 8/2021 | Honjo | H01L 27/1222 |
| 2010/0238717 | A1 | 9/2010 | Nakayama et al. | |
| 2014/0264671 | A1 | 9/2014 | Chepulskyy et al. | |
| 2015/0041933 | A1* | 2/2015 | Chepulskyy | H01F 10/30 257/421 |
| 2019/0304524 | A1* | 10/2019 | Oguz | H01L 43/08 |
| 2020/0090719 | A1* | 3/2020 | Nishioka | H01L 21/8239 |

OTHER PUBLICATIONS

Fukami, S. et al., "Magnetizationswitchingbyspin-Orbittorquein Anantiferromagnet-Ferromagnetbilayersystem", Nature Materials, vol. 15, Feb. 15, 2016, DOI: 10.1038/NMAT4566, pp. 535-542.

Mizunuma, K. et al., "MgO Barrier-Perpendicular Magnetic Tunnel Junctions With CoFe/Pd Multilayers and Ferromagnetic Insertion Layers", Applied Physics Letters, vol. 95, pp. 232516-1-232516-3, 2009.

Yakushiji, K. et al., "Ultrathin Co/Pt and Co/Pd Superlattice Films for MgO-Based Perpendicular Magnetic Tunnel Junctions", Applied Physics Letters, vol. 97, pp. 232508-1-232508-3, 2010.

Honjo, H. et al., "Origin of Variation of Shift Field via Annealing at 400 C in a Perpendicular-Anisotropy Magnetic Tunnel Junction With [Co/Pt]-Multilayers Based Synthetic Ferromagnetic Reference Layer", AIP Advances, vol. 7, pp. 055913-1-055913-5, 2017.

May 7, 2019 Search Repot issued in International Patent Application No. PCT/JP2019/007262.

* cited by examiner

FERROMAGNETIC LAMINATED FILM, SPIN CURRENT MAGNETIZATION ROTATING ELEMENT, MAGNETORESISTANCE EFFECT ELEMENT, AND MAGNETIC MEMORY

TECHNICAL FIELD

The present disclosure relates to a ferromagnetic laminated film and relates also to a spin current magnetization rotating element, a magnetoresistance effect element, and a magnetic memory which include such a ferromagnetic laminated film. Priority is claimed on Japanese Patent Application No. 2018-033101, filed Feb. 27, 2018, the content of which is incorporated herein by reference.

BACKGROUND ART

A giant magnetoresistance (GMR) element formed of a multilayer film including a ferromagnetic layer and a non-magnetic layer, and a tunnel magnetoresistance (TMR) element in which an insulating layer (a tunnel barrier layer, a barrier layer) is used as a non-magnetic layer are known. Generally, although a TMR element has a higher element resistance compared to a GMR element, a magnetoresistance (MR) ratio of a TMR element is larger than an MR ratio of a GMR element. Therefore, attention has been focused on a TMR element as an element for magnetic sensors, high frequency components, magnetic heads, and non-volatile magnetoresistance random access memories (MRAMs).

In an MRAM, data is read and written by utilizing characteristics in which the element resistance of a TMR element changes as magnetization directions of two ferromagnetic layers sandwiching an insulating layer change. As a writing method of MRAMs, a method of performing writing (magnetization reversal) by utilizing a magnetic field generated by a current, and a method of performing writing (magnetization reversal) by utilizing a spin transfer torque (STT) generated by causing a current to flow in a lamination direction of a magnetoresistance element are known. Although magnetization reversal of a TMR element using the STT is efficient when considered from the viewpoint of energy efficiency, it is necessary to cause a current to flow in a lamination direction of the magnetoresistance effect element when data is written. The current for writing may cause characteristics of the magnetoresistance effect element to be deteriorated.

Also, high integration of an MRAM has recently been required. For high integration of the MRAM, it is necessary to reduce a size of the TMR element. However, when a size of the TMR element is reduced, stability of magnetization decreases. When stability of magnetization decreases, data may be unintentionally rewritten due to an influence of heat or the like. In an MRAM, such unintended rewriting of data is not allowed, and it is desirable that thermal stability be high.

On the other hand, in recent years, attention has been focused on a magnetization reversal method utilizing a pure spin current generated by a spin Hall effect as a means for reducing a reversal current using a mechanism different from the STT (for example, Non-Patent Literature 1). A spin-orbit torque (SOT) is induced by a spin current generated by spin-orbit interaction, a Rashba effect at an interface between different materials, breaking of reversal symmetry in a crystal structure, or the like. A current for inducing the SOT in a magnetoresistance effect element flows in a direction intersecting a lamination direction of the magnetoresistance effect element. That is, there is no need to cause a current to flow in a lamination direction of the magnetoresistance effect element, and thus a prolonged life of the magnetoresistance effect element is expected.

According to Non-Patent Literature 1, it is reported that a reversal current density using a SOT method is approximately the same as a reversal current density using a STT method. However, the reversal current density reported in the present SOT method is insufficient for realizing high integration and low energy consumption, and there is room for improvement.

Also, for example, as described in Non-Patent Literature 2, as a perpendicular magnetization film for a magnetoresistance effect element of the SOT method, a ferromagnetic laminated film in which ferromagnetic layers and non-magnetic layers are alternately laminated (for example, $[Co/Pt]_n$) and a ferromagnetic laminated film in which ferromagnetic layers of two types are alternately laminated (for example, $[Co/Ni]_n$) are used. Such a ferromagnetic laminated film is used also in magnetoresistance effect elements of the STT type.

The ferromagnetic laminated film in which ferromagnetic layers and non-magnetic layers are alternately laminated has high magnetic anisotropy but saturation magnetization decreases. On the other hand, the ferromagnetic laminated film in which ferromagnetic layers of two types are alternately laminated has a high saturation magnetization but magnetic anisotropy decreases. In order to exhibit high thermal stability, it is desirable that both the magnetic anisotropy and the saturation magnetization be high.

CITATION LIST

Non-Patent Literature

[Non-Patent Literature 1]
S. Fukami, T. Anekawa, C. Zhang, and H. Ohno, Nature Nanotechnology (2016), DOI: 10.1038/NNANO.2016.29.
[Non-Patent Literature 2]
S. Fukami, C. Zhang, S. DuttaGupta, A. Kurekov and H. Ohno, Nature materials (2016), DOI: 10. 1038/NMAT4566.

SUMMARY OF INVENTION

Technical Problem

The present disclosure has been made in view of the above problems, and it is an objective of the present disclosure to provide a new ferromagnetic laminated film in which a reversal current density is reduced and thermal stability is improved.

Solution to Problem

The present disclosure provides the following means in order to solve the above-described problems.

(1) A ferromagnetic laminated film according to a first aspect of the present disclosure includes a plurality of first magnetic layers, at least one second magnetic layer, and at least one first non-magnetic layer, in which the first magnetic layers are alternately laminated with the second magnetic layer or the first non-magnetic layer, and a material forming the first magnetic layers is different from a material forming the second magnetic layer, and the first magnetic layers, the first non-magnetic layer, and the second magnetic layer are a material combination in which interface magnetic anisotropy is generated between the first magnetic layer and the first non-magnetic layer, and a material combination in which interface magnetic anisotropy is generated between the first magnetic layer and the second magnetic layer.

(2) In the ferromagnetic laminated film according to the above-described aspect, the first magnetic layers may be formed of a ferromagnetic material containing one or both of Co and Fe, the second magnetic layer may be formed of a ferromagnetic material containing Ni, and the first non-magnetic layer may be formed of a non-magnetic material containing at least one of Ti, Zr, Hf, Ru, Rh, Pd, Ag, Ir, Pt, and Au.

(3) In the ferromagnetic laminated film according to the above-described aspect, the first magnetic layers may be formed of a ferromagnetic material containing one or both of Co and Fe, the second magnetic layer may be formed of a ferromagnetic material containing Ni, and the first non-magnetic layer may be formed of a non-magnetic material containing at least one of V, Cr, Mo, Ta and W.

(4) In the ferromagnetic laminated film according to the above-described aspect, a lamination order in which the first magnetic layers are alternately laminated with the second magnetic layer or the first non-magnetic layer may be a lamination order that is asymmetric with respect to a first direction perpendicular to a film surface of the ferromagnetic laminated film.

(5) The ferromagnetic laminated film according to the above-described aspect may include at least one asymmetric five-layer structure in which the first magnetic layer, the second magnetic layer, the first magnetic layer, the first non-magnetic layer, and the first magnetic layer are laminated in order in the first direction.

(6) In the ferromagnetic laminated film according to the above-described aspect, at least one of the first non-magnetic layers may be thicker than any of the plurality of first magnetic layers and the at least one second magnetic layer.

(7) A spin current magnetization rotating element according to a second aspect of the present disclosure includes the ferromagnetic laminated film according to any one of the above-described aspects, and a spin-orbit torque wiring extending in a second direction intersecting a first direction perpendicular to a film surface of the ferromagnetic laminated film and positioned in the first direction from the ferromagnetic laminated film.

(8) A magnetoresistance effect element according to a third aspect of the present disclosure includes the spin current magnetization rotating element according to the above-described aspect, a fixed layer in which a magnetization direction is fixed, and a non-magnetic spacer layer sandwiched between the ferromagnetic laminated film and the fixed layer.

(9) A magnetoresistance effect element according to another aspect of the present disclosure includes the ferromagnetic laminated film according to any one of the above-described aspects as a fixed layer in which a magnetization direction is fixed, and the magnetoresistance effect element further includes a free layer, and a non-magnetic spacer layer sandwiched between the ferromagnetic laminated film and the free layer.

(10) The magnetoresistance effect element according to the above-described aspect (9) may further include an antiferromagnetic coupling layer and an interface ferromagnetic metal layer between the ferromagnetic laminated film and the non-magnetic spacer layer.

(11) In the magnetoresistance effect element according to the above-described aspect, the antiferromagnetic coupling layer may contain Ru, Rh, or Ir.

(12) In the magnetoresistance effect element according to the above-described aspect, a magnetization of the ferromagnetic laminated film may be a perpendicular magnetization.

(13) In the magnetoresistance effect element according to the above-described aspect, a magnetization of the ferromagnetic laminated film may be inclined with respect to a film lamination direction.

(14) A magnetic memory according to a fourth aspect of the present disclosure includes the plurality of magnetoresistance effect elements according to any one of the above-described aspects.

Advantageous Effects of Invention

According to the ferromagnetic laminated film according to the present disclosure, a reversal current density can be reduced and thermal stability can be improved.

DESCRIPTION OF EMBODIMENTS

Hereinafter, preferred examples of embodiments of the present disclosure will be described in detail with reference to the drawings as appropriate. In the drawings used in the following description, there are cases in which characteristic portions are enlarged and schematically illustrated for convenience so that characteristics of the embodiment of the present disclosure can be easily understood, and dimensional proportions of respective constituent elements may be different from actual ones. Materials, dimensions, and the like illustrated in the following description are merely examples, and the present disclosure is not limited thereto, and the number, numerical values, amounts, ratios, characteristics, and the like can be implemented with appropriate modifications within a range in which the effects of the present disclosure are achieved. In the elements of the embodiments of the present disclosure, other layers may be provided within a range of achieving effects of the present disclosure.

(Ferromagnetic Laminated Film)

Figure 1:
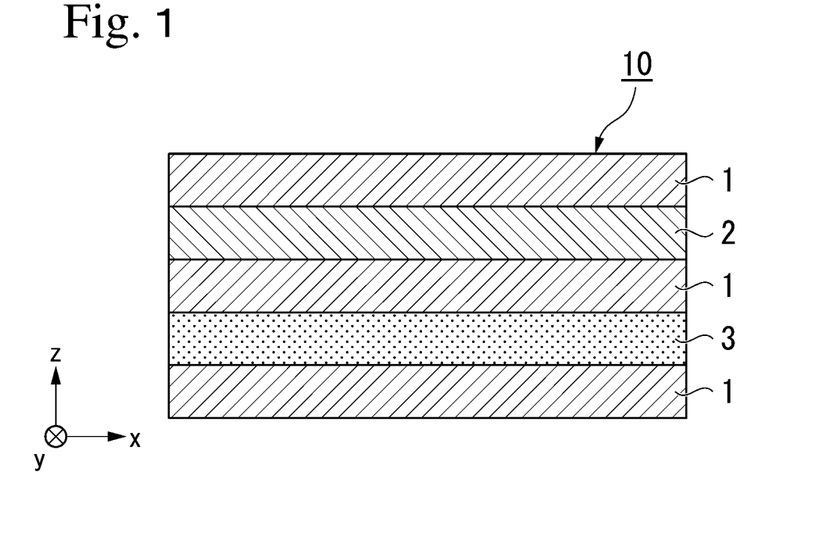
FIG. 1 is a schematic view illustrating an example of a cross-sectional structure of a ferromagnetic laminated film according to one embodiment of the present disclosure.

FIG. 1 is a schematic view illustrating an example of a cross-sectional structure of a ferromagnetic laminated film according to one embodiment of the present disclosure. In the following description, for convenience, a direction perpendicular to a film surface of the ferromagnetic laminated film or a lamination direction is referred to as a first direction (z direction, thickness direction), a direction perpendicular to the first direction and following a longitudinal direction of the ferromagnetic laminated film is referred as a second direction (x direction, length direction), and a direction perpendicular to both the first direction and the second direction is referred to as a third direction (y direction, width direction).

A ferromagnetic laminated film 10 illustrated in FIG. 1 includes a plurality of first magnetic layers 1, at least one second magnetic layer 2, and at least one first non-magnetic layer 3, and the first magnetic layers 1 are alternately laminated with the second magnetic layer 2 or the first non-magnetic layer 3.

<First Magnetic Layer>

The first magnetic layers 1 are formed of a ferromagnetic material. Known materials can be used for the ferromagnetic material forming the first magnetic layers 1. For example, a metal such as cobalt (Co) whose crystal structure as a single substance at room temperature exhibits a hexagonal close-packed (hcp) structure or a face-centered cubic lattice (fcc), or a metal such as iron (Fe) whose crystal structure as a single substance at room temperature exhibits a body-centered cubic lattice (bcc) structure can be exemplified as the material forming the first magnetic layers 1. These metals may be used as single substances such that the above-described crystal structures are exhibited or may be used as an alloy (for example, Co—Fe alloy) or a compound which contains one or more of these metals to exhibit ferromagnetism.

<Second Magnetic Layer>

The second magnetic layer 2 is formed of a ferromagnetic material different from the ferromagnetic material forming the first magnetic layers 1. Known materials can be used also for the ferromagnetic material forming the second magnetic layer 2. For example, a metal such as nickel (Ni) whose crystal structure as a single substance at room temperature exhibits a face-centered cubic lattice (fcc) structure, or a metal such as gadolinium (Gd) whose crystal structure as a single substance at room temperature has a hexagonal close-packed (hcp) structure can be exemplified as the material forming the second magnetic layer 2. These metals may be used as single substances to exhibit the above-described crystal structures or may be used as an alloy or a compound which contains one or more of these metals to exhibit ferromagnetism. Particularly, the ferromagnetic material forming the second magnetic layer 2 is selected such that an interface magnetic anisotropy is generated when the second magnetic layer 2 is in contact with the first magnetic layer 1 to form an interface. Particularly, the ferromagnetic material forming the second magnetic layer 2 is preferably selected to give a perpendicular magnetic anisotropy in a direction perpendicular to a surface of the ferromagnetic laminated film 10. For example, although not limited to these, a combination of the first magnetic layer 1/the second magnetic layer 2 can be Co/Ni, Fe/Ni, Co/Gd, Ni/Co, Ni/Fe, or the like, preferably Co/Ni, Fe/Ni, or Co/Gd is effective, and it is more preferably Co/Ni.

<First Non-Magnetic Layer>

The first non-magnetic layer 3 is formed of a non-magnetic material. Particularly, the non-magnetic material forming the first non-magnetic layer 3 is selected such that an interface magnetic anisotropy is generated when the first non-magnetic layer 3 is in contact with the first magnetic layer 1 to form an interface. Particularly, the non-magnetic material forming the first non-magnetic layer 3 is selected to give a perpendicular magnetic anisotropy in a direction perpendicular to the surface of the ferromagnetic laminated film 10. Known materials can be used also for the non-magnetic material forming such a first non-magnetic layer 3. A metal whose crystal structure as a single substance at room temperature exhibits a hcp structure, a metal whose crystal structure as a single substance at room temperature exhibits a fcc structure, a metal whose crystal structure as a single substance at room temperature exhibits a bcc structure, or the like can be exemplified as the non-magnetic material forming the first non-magnetic layer 3. The metal whose crystal structure as a single substance at room temperature exhibits a hcp structure may be, for example, titanium (Ti), zirconium (Zr), hafnium (Hf), ruthenium (Ru), or the like, the metal whose crystal structure as a single substance at room temperature exhibits a fcc structure may be, for example, rhodium (Rh), palladium (Pd), silver (Ag), iridium (Ir), platinum (Pt), gold (Au), or the like, the metal whose single crystal structure at room temperature exhibits a bcc structure may be, for example, vanadium (V), chromium (Cr), molybdenum (Mo), tantalum (Ta), tungsten (W) or the like. These metals may be used as single substances to exhibit the above-described crystal structures or may be used as a non-magnetic alloy or a compound which contains one or more of these metals.

When the first magnetic layers 1, the second magnetic layer 2, and the first non-magnetic layer 3 constituting the ferromagnetic laminated film 10 are all uniformized to contain metals exhibiting an fcc structure or hcp structure (which can be arbitrarily selected such as, for example, Co/Ni/Co/Pt/Co or Co/Ni/Co/Pd/Co), crystal conformity in the ferromagnetic laminated film 10 can be achieved, and thus excellent effects regarding reducing a reversal current density and improving thermal stability can be obtained. On the other hand, in a case in which the ferromagnetic laminated film 10 contains a metal exhibiting a bcc structure (for example, in a case in which the first non-magnetic layer 3 contains W that exhibits a bcc structure), when the ferromagnetic laminated film 10 is used in a combination such as Co—Fe—B/MgO/Co—Fe—B or the like exhibiting a bcc structure in the crystal phase, crystal conformity can easily be achieved and reduction of perpendicular magnetic anisotropy due to heating can be curbed.

The first magnetic layer 1, the second magnetic layer 2, and the first non-magnetic layer 3 may have thicknesses which are not particularly limited, and may each have a thickness of, for example, 0.2 to 3.0 nm. Also, the plurality of first magnetic layers 1 may not all have the same thickness. This point is the same when there are a plurality of second magnetic layers 2 or first non-magnetic layers 3. That is, the plurality of second magnetic layers 2 or first non-magnetic layers 3 may not all have the same thickness. According to one embodiment, at least one of the first non-magnetic layers 3 may be thicker than any of the plurality of first magnetic layers and the at least one second magnetic layer. Advantages of this configuration will be described in more detail in relation to the following spin current magnetization rotational element.

The ferromagnetic laminated film 10 illustrated in FIG. 1 has a five-layer structure (three first magnetic layers 1, one second magnetic layer, and one first non-magnetic layer) configured in a lamination order of the first magnetic layer 1/the second magnetic layer 2/the first magnetic layer 1/the first non-magnetic layer 3/the first magnetic layer 1 in sequence from the top in the first direction (z direction). In the ferromagnetic laminated film 10 illustrated in FIG. 1, the first magnetic layers 1 are alternately laminated with either the second magnetic layer 2 or the first non-magnetic layer 3. As an example of such a lamination, Co/Ni/Co/Pt (or Pd)/Co can be exemplified.

In the example illustrated in FIG. 1, interface portions in which the first magnetic layers 1 and the first non-magnetic layer 3 are joined exhibit high magnetic anisotropy. On the other hand, interface portions in which the first magnetic layers 1 and the second magnetic layer 2 are joined exhibit a high saturation magnetization. Accordingly, the ferromagnetic laminated film 10 as a whole has both high magnetic anisotropy and high saturation magnetization, and thereby thermal stability can be improved.

Also, in the example illustrated in FIG. 1, the lamination order in which the first magnetic layers 1 are alternately laminated with the second magnetic layer 2 or the first non-magnetic layer 3 is asymmetric with respect to the first direction (the z direction) perpendicular to the film surface of the ferromagnetic laminated film. That is, when viewed from the first non-magnetic layer 3, an upper structure portion (the first magnetic layer 1/the second magnetic layer 2/the first magnetic layer 1 in order when viewed from the first non-magnetic layer 3) and a lower structure portion (first magnetic layer) are asymmetric in the first direction (the z direction). Also, when viewed also from the first magnetic layer 1 at a center, an upper structure portion (the second magnetic layer 2/the first magnetic layer 1 in order when viewed from the first magnetic layer 1 at the center) and a lower structure portion (the first non-magnetic layer 3/the first magnetic layer 1 in order when viewed from the first magnetic layer 1 at the center) are asymmetric. As will be described in detail below, the ferromagnetic laminated film 10 having such an asymmetric structure can be a useful structure when it is used in a spin current magnetization rotating element in a spin-orbit torque (SOT) method and can reduce a reversal current density.

Figure 2:
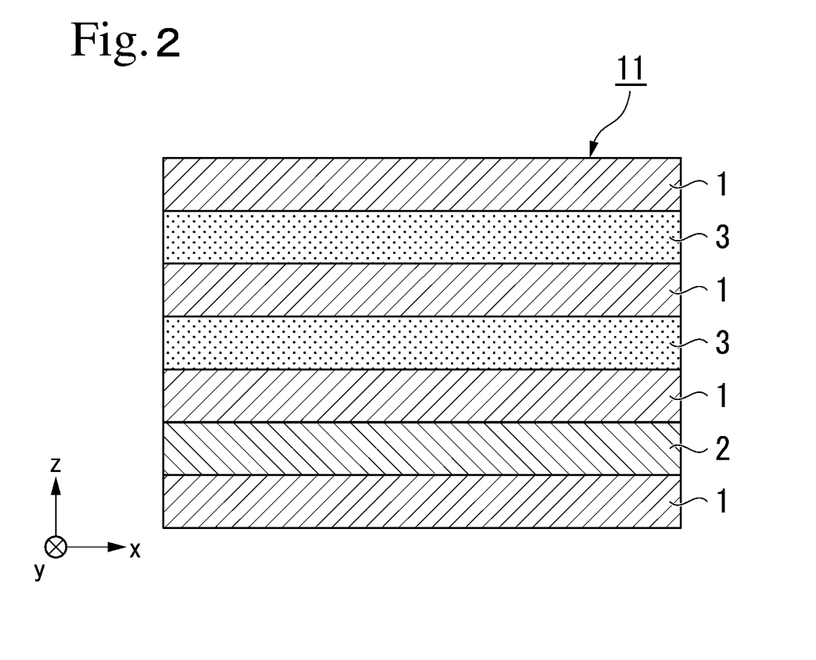
FIG. 2 is a schematic view illustrating an example of a cross-sectional structure of a ferromagnetic laminated film according to one embodiment of the present disclosure.

The ferromagnetic laminated film according to the present embodiment is not limited to the five-layer structure or the asymmetric structure as illustrated in FIG. 1. The ferromagnetic laminated film according to the present embodiment can also have other structures in which the first magnetic layers 1 are alternately laminated with either the second magnetic layer 2 or the first non-magnetic layer 3 according to desired applications and characteristics. For example, FIG. 2 is a schematic view illustrating another example of a cross-sectional structure of a ferromagnetic laminated film 11 according to the present embodiment. The ferromagnetic laminated film 11 illustrated in FIG. 2 has a seven-layer structure of the first magnetic layer 1/the first non-magnetic layer 3/the first magnetic layer 1/the first non-magnetic layer 3/the first magnetic layer 1/the second magnetic layer 2/the first magnetic layer 1 (which can be arbitrarily selected such as, for example, Co/Pt/Co/Pt/Co/Ni/Co) in order from the top in the first direction (the z direction). In the ferromagnetic laminated film 11, an upper structure portion and a lower structure portion are asymmetric when viewed from the first non-magnetic layer 3 at a center, similarly to the ferromagnetic laminated film 10 in FIG. 1.

Figure 3:
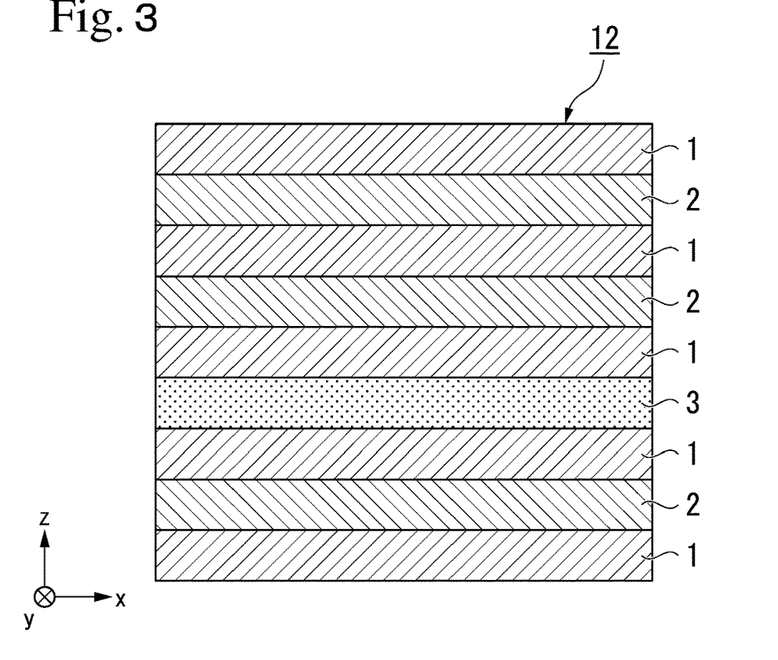
FIG. 3 is a schematic view illustrating an example of a cross-sectional structure of a ferromagnetic laminated film according to one embodiment of the present disclosure.

FIG. 3 is a schematic view illustrating another example of a cross-sectional structure of a nine-layer structured ferromagnetic laminated film 12 according to the present embodiment. The ferromagnetic laminated film 12 illustrated in FIG. 3 has a lamination order of the first magnetic layer 1/the second magnetic layer 2/the first magnetic layer 1/the second magnetic layer 2/the first magnetic layer 1/the first non-magnetic layer 3/the first magnetic layer 1/the second magnetic layer 2/the first magnetic layer 1 (which can be arbitrarily selected such as, for example, Co/Ni/Co/Ni/Co/Pt/Co/Ni/Co) in sequence from the top in the first direction (the z direction). Also in the ferromagnetic laminated film 12 illustrated in FIG. 3, an upper structure portion and a lower structure portion are asymmetric when viewed from the first non-magnetic layer 3 included in only one layer or from the first magnetic layer 1 at a center.

Figure 4:
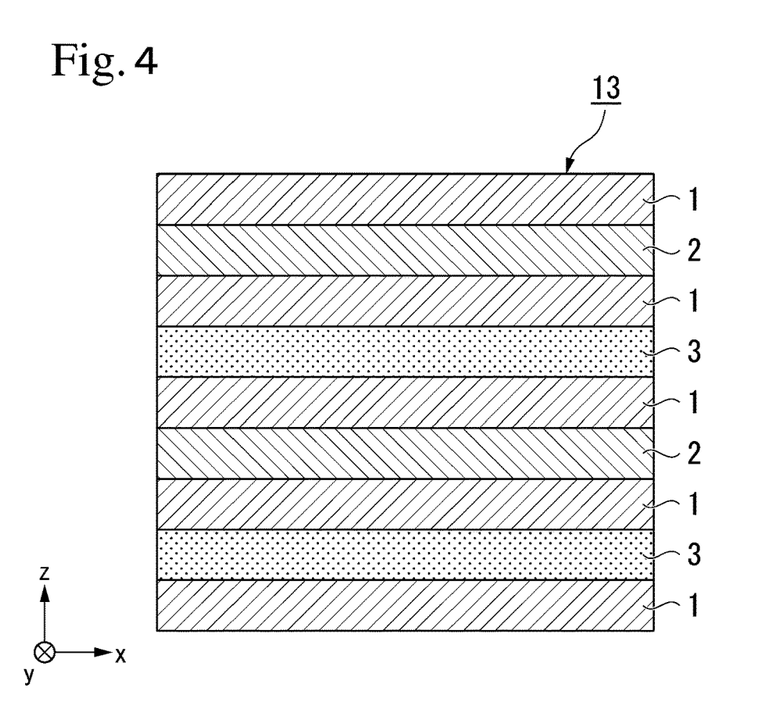
FIG. 4 is a schematic view illustrating an example of a cross-sectional structure of a ferromagnetic laminated film according to one embodiment of the present disclosure.

FIG. 4 is a schematic view illustrating another example of a cross-sectional structure of a nine-layer structured ferromagnetic laminated film 13 according to the present embodiment. The ferromagnetic laminated film 13 illustrated in FIG. 4 has a lamination order of the first magnetic layer 1/the second magnetic layer 2/the first magnetic layer 1/the first non-magnetic layer 3/the first magnetic layer 1/the second magnetic layer 2/the first magnetic layer 1/the first non-magnetic layer 3/the first magnetic layer 1 (which can be arbitrarily selected such as, for example, Co/[Ni/Co/Pt/Co]$_2$) in sequence from the top in the first direction (the z direction). Such a laminated structure is regarded as having [Ni/Co/Pt/Co] as a repeating unit and can be extended to Co/[Ni/Co/Pt/Co]$_n$ having a number of layers larger than nine (n is a number of repetitions larger than 2).

Figure 5:
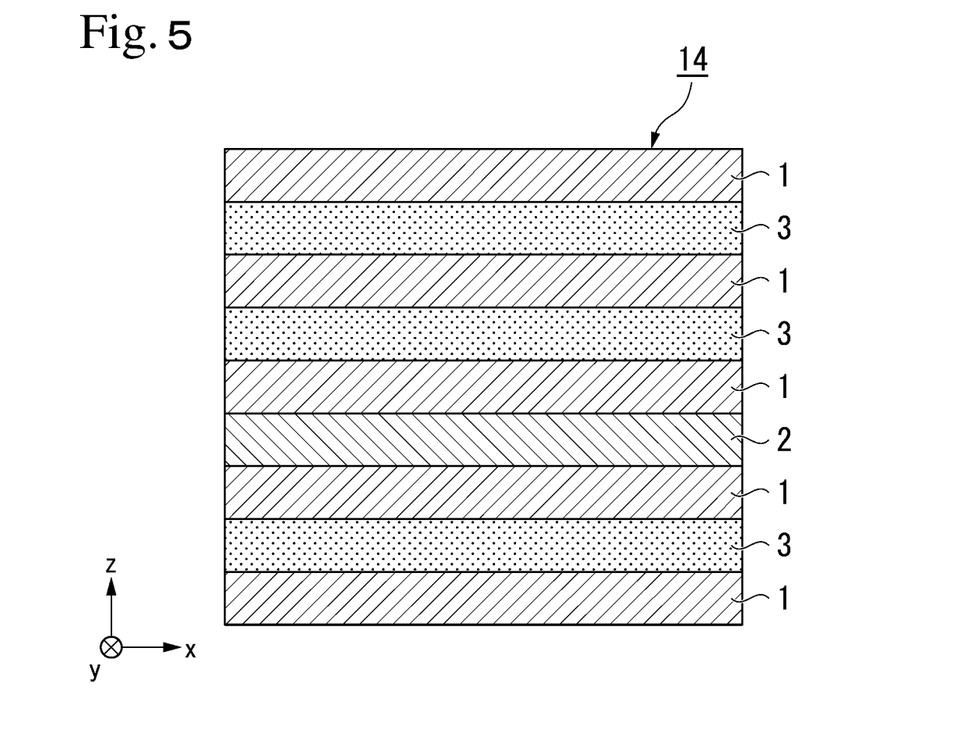
FIG. 5 is a schematic view illustrating an example of a cross-sectional structure of a ferromagnetic laminated film according to one embodiment of the present disclosure.

FIG. 5 is a schematic view illustrating another example of a cross-sectional structure of a nine-layer structured ferromagnetic laminated film 14 according to the present embodiment. The ferromagnetic laminated film in FIG. 5 has a lamination order of the first magnetic layer 1/the first non-magnetic layer 3/the first magnetic layer 1/the first non-magnetic layer 3/the first magnetic layer 1/the second magnetic layer 2/the first magnetic layer 1/the first non-magnetic layer 3/the first magnetic layer 1 (which can be arbitrarily selected such as, for example, Co/Pt/Co/Pt/Co/Ni/Co/Pt/Co) in sequence from the top in the first direction (the z direction). Even in such a structure in which only one second magnetic layer 2 is provided, an interface portion in which the first magnetic layer 1 and the second magnetic layer 2 are joined exhibits high saturation magnetization, an interface portion in which the first magnetic layer 1 and the first non-magnetic layer 3 are joined exhibits high magnetic anisotropy, and thereby thermal stability can be improved.

Modified Example

Figure 6:
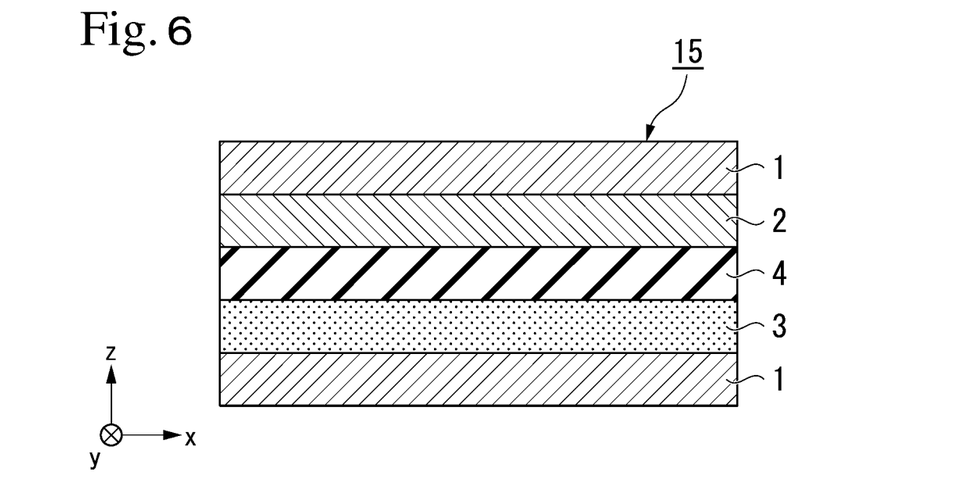
FIG. 6 is a schematic view illustrating an example of a cross-sectional structure of a ferromagnetic laminated film according to one embodiment of the present disclosure.
Figure 7:
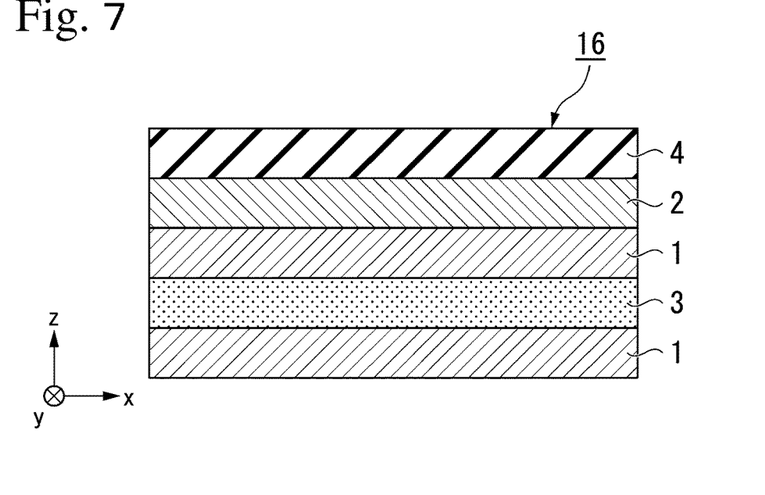
FIG. 7 is a schematic view illustrating an example of a cross-sectional structure of a ferromagnetic laminated film according to one embodiment of the present disclosure.

Also, in a modified example of the ferromagnetic laminated film according to the present embodiment, the plurality of first magnetic layers 1 may not be all formed of the same material. That is, a material forming one or some of the first magnetic layers 1 may be different from a material forming the other first magnetic layers 1. In other words, one or some of the plurality of first magnetic layers 1 may be formed of a material different from the material forming the other first magnetic layers 1. Here, when one or some layers formed of a material different from the material forming the other first magnetic layers 1 are referred to as the third magnetic layers 4, materials can be arbitrarily selected from the above-described materials, and, for example, Co may be used for the first magnetic layer 1 and Fe may be used for the third magnetic layer 4, or Fe may be used for the first magnetic layer 1 and Co may be used for the third magnetic layer 4. FIGS. 6 and 7 are schematic views illustrating examples of modified examples of the ferromagnetic laminated film according to the present embodiment. A ferromagnetic laminated film 15 illustrated in FIG. 6 has a five-layer structure of the first magnetic layer 1/the second magnetic layer 2/the third magnetic layer 4/the first non-magnetic layer 3/the first magnetic layer 1 (which can be arbitrarily selected such as, for example, Co/Ni/Fe/Pt (or Pd)/Co) in order from the top in the first direction (the z direction). A ferromagnetic laminated film 16 illustrated in FIG. 7 has a five-layer structure of the third magnetic layer 4/the second magnetic layer 2/the first magnetic layer 1/the first non-magnetic layer 3/the first magnetic layer 1 (which can be arbitrarily selected such as, for example, Fe/Ni/Co/Pt/Co) in order from the top in the first direction (the z direction).

Similarly, when there are a plurality of second magnetic layers 2 and first non-magnetic layers 3, the plurality of second magnetic layers 2 may not be all formed of the same material, and the plurality of first non-magnetic layers 3 may not be all formed of the same material. For example, of the plurality of second magnetic layers 2, a material different from a material forming the other second magnetic layers 2 may be used for one or some layers. Also, of the plurality of first non-magnetic layers 3, a material forming the other first non-magnetic layers 3 may be changed with respect to that used for one or some layers.

Ferromagnetic laminated films are used, for example, in spin current magnetization rotating elements. Specifically, it can be used as a free layer in a magnetoresistance effect element having the spin current magnetization rotating element. When a ferromagnetic laminated film is used as the free layer, an additional ferromagnetic metal film such as a Co—Fe—B alloy may be inserted between the ferromagnetic laminated film and a non-magnetic spacer layer to increase a magnetoresistance effect. Further, a non-magnetic insertion layer for cutting off crystal growth of the ferromagnetic laminated film and the additional ferromagnetic metal film may be inserted between the above-described ferromagnetic laminated film and the above-described additional ferromagnetic metal film. Also, more broadly, the above-described ferromagnetic laminated film can be used as a fixed layer in general magnetoresistance effect elements of a spin-orbit torque (SOT) method, a spin transfer torque (STT) method, or the like. Hereinafter, embodiments of elements using the ferromagnetic laminated film according to the present embodiment will be described.

(Spin Current Magnetization Rotating Element)

Figure 8:
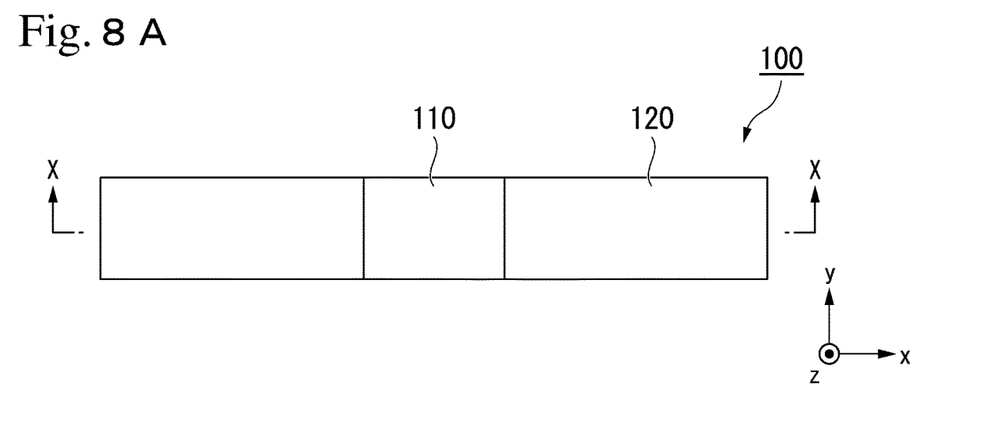
FIG. 8A is a schematic plan view for explaining a spin current magnetization rotating element according to one embodiment of the present disclosure.
FIG. 8B is a schematic cross-sectional view for explaining the spin current magnetization rotating element according to one embodiment of the present disclosure.

FIG. 8 is a schematic view illustrating an example of a spin current magnetization rotating element according to one embodiment of the present disclosure. FIG. 8A is a plan view, and FIG. 8B is a cross-sectional view taken along line X-X, which is a center line in a width direction of a spin-orbit torque wiring 120 in FIG. 8A.

A spin current magnetization rotating element 100 illustrated in FIG. 8 includes a ferromagnetic laminated film 110 in which a magnetization direction changes, and the spin-orbit torque wiring 120 extending in a second direction (x direction) intersecting the first direction (z direction) which is a direction perpendicular to a surface of the ferromagnetic laminated film 110 and positioned in the first direction from the ferromagnetic laminated film 110. Further, in FIG. 8, the ferromagnetic laminated film 110 is illustrated to be joined to the spin-orbit torque wiring 120, but another layer or the like may be included between the ferromagnetic laminated film 110 and the spin-orbit torque wiring 120. Further, FIG. 8B also illustrates a power supply 130 for energizing the spin-orbit torque wiring 120 when a magnetization of the ferromagnetic laminated film 110 is rotated.

The spin current magnetization rotating element 100 of the present embodiment, that is, an element that performs magnetization rotation of a ferromagnetic material using a SOT effect due to a spin current can be used in a magnetoresistance effect element that performs magnetization reversal of a ferromagnetic material only using the SOT due to a spin current. In the present specification, an element that performs magnetization rotation of the ferromagnetic material using the SOT effect due to a spin current is particularly referred to as a spin current magnetization rotational element. On the other hand, the spin current magnetization rotating element of the present embodiment can be used as an assisting means or main means for magnetization reversal of a ferromagnetic material in a magnetoresistance effect element using a conventional STT.

<Ferromagnetic Laminated Film>

The ferromagnetic laminated film 110 is the ferromagnetic laminated film according to the present disclosure such as, for example, any one of the ferromagnetic laminated films 10 to 16 illustrated in FIGS. 1 to 7, and is preferably an asymmetric ferromagnetic laminated film such as the ferromagnetic laminated films 10 to 12 illustrated in FIGS. 1 to 3.

<Spin-Orbit Torque Wiring>

The spin-orbit torque wiring 120 is formed of a material that generates a spin current due to a spin Hall effect and induces a spin-orbit torque when a current flows therethrough. In other words, a material of the spin-orbit torque wiring 120 may be any material as long as a spin current is generated in the spin-orbit torque wiring 120. Therefore, the material of the spin-orbit torque wiring 120 is not limited to a material formed of an element as a single substance, and a material having a portion formed of a material from which a spin current is generated and a portion formed of a material from which no spin current is generated, or the like may be used.

The spin Hall effect is a phenomenon in which a pure spin current is induced in a direction perpendicular to a current direction on the basis of spin-orbit interaction when a current is caused to flow through a material.

Figure 9:
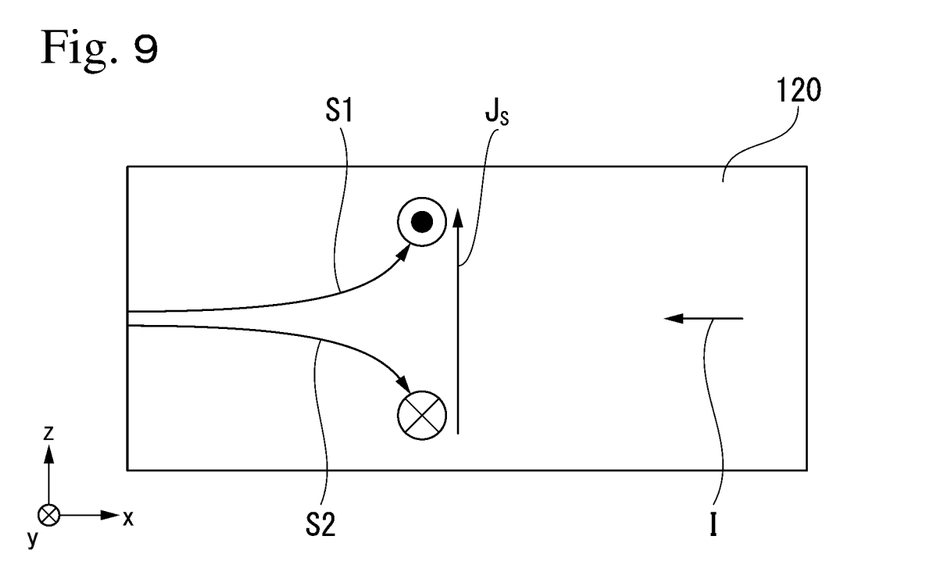
FIG. 9 is a schematic view for explaining a spin Hall effect.

FIG. 9 is a schematic view for explaining a spin Hall effect. FIG. 9 is a cross-sectional view taken along the x direction of the spin-orbit torque wiring 120 in FIGS. 8A and 8B. A mechanism in which a pure spin current is generated by the spin Hall effect will be described on the basis of FIG. 9.

As illustrated in FIG. 9, when a current 1 is caused to flow in a direction in which the spin-orbit torque wiring 120 extends, a first spin S1 oriented to a side close to the paper surface and a second spin S2 oriented to a side far from the paper surface are respectively bent in a direction perpendicular to the current. A normal Hall effect and a spin Hall effect are the same in that electric charges (electrons) in a motion (movement) are bent in a direction of the motion (movement), but, while charged particles moving in a magnetic field are subjected to a Lorentz force and a direction of the motion is bent in the normal Hall effect, the spin Hall effect is greatly different in that, even though there is no magnetic field, when electrons merely move (when a current merely flows), a moving direction thereof is bent.

Since the number of electrons of the first spin S1 is equal to the number of electrons of the second spin S2 in a non-magnetic material (a material which is not a ferromagnetic material), the number of electrons of the first spin S1 directed upward and the number of electrons of the second spin S2 directed downward in the drawing are the same. Thus, the current as a net flow of charge is zero. This spin current that does not accompany a current is particularly called a pure spin current.

When a current is caused to flow through a ferromagnetic material, it is the same in that the first spin S1 and the second spin S2 are bent in opposite directions. On the other hand, the inside of the ferromagnetic material is in a state in which either the first spin S1 or the second spin S2 is greater than the other. Therefore, when a current is caused to flow through a ferromagnetic material, a net flow of electric charge occurs (a voltage is generated) as a result, which is different from a case in which a current is caused to flow in a non-magnetic material. Therefore, the material of the spin-orbit torque wiring 120 is preferably a non-magnetic material.

The non-magnetic material of the spin-orbit torque wiring 120 may contain a non-magnetic heavy metal. Here, the term "heavy metal" is used to mean a metal having a specific gravity equal to or higher than that of yttrium. The spin-orbit torque wiring 120 may be formed of only a non-magnetic heavy metal.

In this case, the non-magnetic heavy metal is preferably a non-magnetic metal having a high atomic number such as the atomic number of 39 or higher having d electrons or f electrons in the outermost shell. This is because such a non-magnetic metal having a high atomic number such as the atomic number of 39 or higher having d electrons or f electrons in the outermost shell has a large spin-orbit interaction which causes the spin Hall effect. The spin-orbit torque wiring 120 may be formed of only a non-magnetic metal having a high atomic number such as an atomic number of 39 or higher having d electrons or f electrons in the outermost shell. As such a non-magnetic metal, for example, Mo, Ru, Rh, Pd, Ta, W, Ir, Pt, Au, Bi, or the like can be exemplified.

Normally, when a current is caused to flow in a metal, all the electrons move in a direction opposite to the current regardless of an orientation of the spin. In contrast, since a non-magnetic metal with a high atomic number having d electrons and f electrons in the outermost shell has a large spin-orbit interaction, a movement direction of the electrons depends on an orientation of electron spin due to the spin Hall effect and thus a pure spin current $J_S$ is easily generated.

Here, when a flow of electrons in the first spin $S_1$ is expressed as $J_\uparrow$, a flow of electrons in the second spin $S_2$ is expressed as $J_\downarrow$, and a spin current is expressed as $J_S$, $J_S = J_\uparrow - J_\downarrow$ is defined. In FIG. 2, the $J_S$ as the pure spin current flows upward in the drawing. Here, the $J_S$ is a flow of electrons with a polarizability of 100%.

The spin current magnetization rotating element 100 of the present disclosure has a configuration in which a current is caused to flow through the spin-orbit torque wiring 120 to cause a spin current to be generated as described above and the spin current diffuses into the ferromagnetic laminated film 110 which is in contact with the spin-orbit torque wiring 120, and thereby magnetization rotation of the ferromagnetic laminated film 110 is caused to occur by the spin-orbit torque (SOT) effect due to the spin current. When the SOT effect is sufficiently large, the magnetization of the ferromagnetic laminated film 110 is reversed. The spin current magnetization rotating element of the present embodiment in which the magnetization of the ferromagnetic laminated film 110 is reversed can be particularly called a spin current magnetization rotational element.

Further, in the spin current magnetization rotating element 100 of the present embodiment, a SOT can be induced also in the ferromagnetic laminated film 110. That is, when a current is caused to flow through the spin-orbit torque wiring 120, the current also flows into the ferromagnetic laminated film 110 joined to the spin-orbit torque wiring 120. The ferromagnetic laminated film 110 includes at least one first non-magnetic layer 3, and the first non-magnetic layer 3 may include a heavy metal having strong spin-orbit interaction such as Pt, Pd, Ag, or Mo. Therefore, a spin current is generated in the first non-magnetic layer 3. Also, the ferromagnetic laminated film 110 may have an asymmetric structure as illustrated in FIGS. 1 to 3 as an example. When the spin current generated in the first non-magnetic layer 3 diffuses into the asymmetric structure, an additional spin-orbit torque effect causing magnetization rotation occurs. Therefore, in the spin current magnetization rotating element 100 of the present embodiment, a reversal current can be further reduced compared to a case in which the spin-orbit torque effect is generated only in the spin-orbit torque wiring 120.

In one embodiment, as described above, at least one of the first non-magnetic layers 3 included in the ferromagnetic laminated film 110 can be thicker than any of the plurality of first magnetic layers 1 and at least one second magnetic layer 2. In such a configuration, when a current flows into the ferromagnetic laminated film 110, the current flows mostly through the first non-magnetic layer 3, and the spin current can be efficiently generated by an increased amount of heavy metal contained in the thick first non-magnetic layer 3.

The spin current magnetization rotating element of the present embodiment can be applied to a magnetoresistance effect element as will be described below. However, applications are not limited to the magnetoresistance effect element and it can be applied to other applications. As other applications, for example, although not limited to these, the spin current magnetization rotating element can be arranged at each pixel to be used in a spatial light modulator in which incident light is spatially modulated using a magneto-optical effect, and a magnetic field applied to an axis of easy magnetization of a magnet may be replaced with a SOT in order to avoid a hysteresis effect due to a coercivity of the magnet in a magnetic sensor.

(Magnetoresistance Effect Element)

A magnetoresistance effect element according to one embodiment of the present disclosure includes the spin current magnetization rotating element 100 of the present embodiment.

Figure 10:
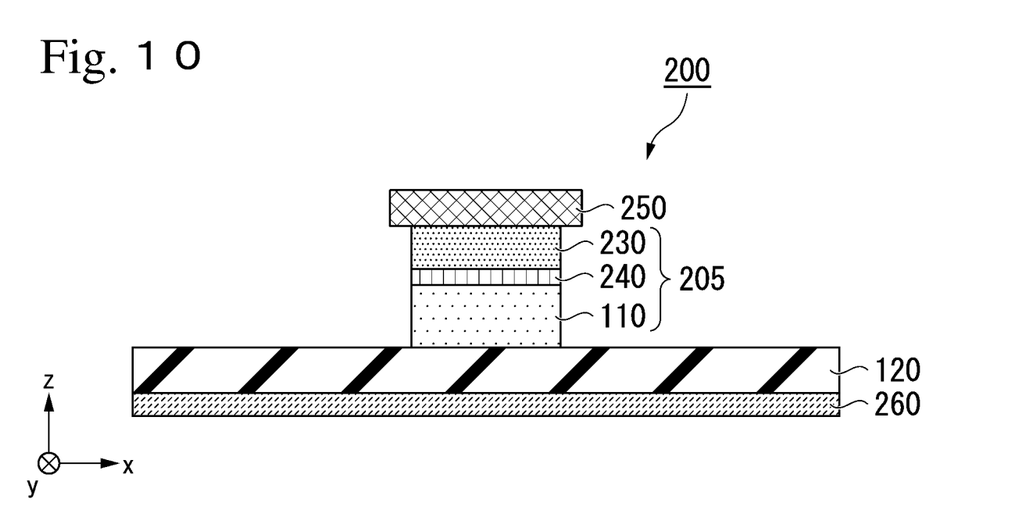
FIG. 10 is a schematic view illustrating an example of a cross-sectional structure of a magnetoresistance effect element according to one embodiment of the present disclosure.

FIG. 10 schematically illustrates a cross-sectional structure of a magnetoresistance effect element 200 according to one embodiment including the spin current magnetization rotating element 100 of the present embodiment.

The magnetoresistance effect element 200 illustrated in FIG. 10 includes the spin current magnetization rotating element 100 of the present embodiment, a fixed layer 230 in which a magnetization direction is fixed, and a non-magnetic spacer layer 240 sandwiched between the ferromagnetic laminated film 110 and the fixed layer 230. Here, since the spin current magnetization rotating element includes the ferromagnetic laminated film 110 and the spin-orbit torque wiring 120, the magnetoresistance effect element 200 illustrated in FIG. 10 can be rephrased as having a magnetoresistance effect element part 205 to be described below and the spin-orbit torque wiring 120.

The magnetoresistance effect element 200 according to one embodiment of the present disclosure includes the spin-orbit torque wiring 120, and thereby it is also possible to have a configuration in which magnetization reversal of the magnetoresistance effect element is performed using only the SOT due to a spin current, and it is also possible to have a configuration in which the SOT due to a spin current is used in combination in a conventional magnetoresistance effect element using the STT.

FIG. 10 also illustrates a wiring 250 for causing a current to flow in a lamination direction of the magnetoresistance effect element 200, and a substrate 260 on which the magnetoresistance effect element 200 is manufactured.

<Magnetoresistance Effect Element Part>

The magnetoresistance effect element part 205 includes the ferromagnetic laminated film 110 of the present embodiment used as a free layer (also called a free layer, a storage layer, a recording layer, or the like) in which a magnetization direction changes, the fixed layer 230 (also called a pin layer, a pinned layer, or the like) in which a magnetization direction is fixed, and the non-magnetic spacer layer 240 sandwiched between the ferromagnetic laminated film 110 and the fixed layer 230.

In the magnetoresistance effect element part 205, a magnetization of the fixed layer 230 is fixed in one direction, and a direction of the magnetization of the ferromagnetic laminated film 110 changes relatively. When it is applied to a coercivity-differed type (pseudo spin valve type) magnetic random access memory (MRAM), a coercivity of the fixed layer 230 is larger than a coercivity of the free layer (ferromagnetic laminated film 110). When it is applied to an exchange bias type (spin valve type) MRAM, the magnetization direction of the fixed layer 230 is fixed by exchange coupling with an additional antiferromagnetic layer.

Also, when the non-magnetic spacer layer 240 is made of an insulator, the magnetoresistance effect element part 205 is a tunneling magnetoresistance (TMR) element. When the non-magnetic spacer layer 240 is made of a metal, the magnetoresistance effect element part 205 is a giant magnetoresistance (GMR) element.

For the magnetoresistance effect element part 205 provided in the present embodiment, a configuration of a known magnetoresistance effect element part can be employed. Although the magnetoresistance effect element part 205 is not limited to these examples, for example, each layer other than the ferromagnetic laminated film 110 may be formed of a plurality of layers, or other layers such as an antiferromagnetic layer for fixing a magnetization direction of the fixed layer 230 may be provided.

The ferromagnetic laminated film 110 as a free layer is preferably a perpendicular magnetization film having a magnetization perpendicular to the film surface. Therefore, the fixed layer 230 is preferably formed as a perpendicular magnetization film in which a magnetization direction is perpendicular to the layer.

Also, the magnetization of the ferromagnetic laminated film 110 is effective also when the magnetization is inclined with respect to the film lamination direction. When a direction of the magnetization of the ferromagnetic laminated film 110 used as the free layer is inclined, a magnetization reversal current value can be reduced when the ferromagnetic laminated film 110 is used as the SOT and STT. That is, a current required for performing magnetization reversal can be reduced. Also, even when the ferromagnetic laminated film 110 is used as the SOT, if a direction of the magnetization of the ferromagnetic laminated film 110 is inclined, magnetization reversal in the absence of a magnetic field can be performed.

For a material of the fixed layer 230, a known material can be used. For example, a metal selected from a group consisting of Cr, Mn, Co, Fe and Ni, and an alloy containing one or more of these metals and exhibiting ferromagnetism can be used. It is also possible to use an alloy containing these metals and at least one of the elements B, C, and N. Specifically, Co—Fe, Co—Fe—B, or the like can be exemplified as the material of the fixed layer 230.

Also, in order to obtain a higher output, it is preferable to use a Heusler alloy such as $Co_2FeSi$ for the material of the fixed layer 230. A Heusler alloy is an alloy containing an intermetallic compound having a chemical composition of XYZ or $X_2YZ$, in which X, Y, and Z are as follows. Here, X indicates a transition metal element or a noble metal element from the Co, Fe, Ni, or Cu groups in the Periodic Table. Y indicates a transition metal from the Mn, V, Cr, or Ti groups, or an element from the groups for X. Z indicates a typical element from Group III to Group V. That is, examples of the Heusler alloy include, but are not limited to, $Co_2FeSi$, $Co_2MnSi$, $Co_2Mn_{1-a}Fe_aAl_bS1_{1-b}$, and the like.

Also, in order to further increase a coercivity of the fixed layer 230 with respect to the ferromagnetic laminated film 110, an antiferromagnetic material layer such as IrMn or PtMn may be used on a surface of the fixed layer 230 on a side opposite to a surface with which the non-magnetic spacer layer 240 is in contact as a layer (pinning layer) in contact with the fixed layer 230. Further, in order to prevent a leakage magnetic field of the fixed layer 230 from affecting the ferromagnetic laminated film 110, a synthetic ferromagnetic coupling structure may also be employed.

For a material of the non-magnetic spacer layer 240, a known material can be used. For example, when the non-magnetic spacer layer 240 is made of an insulator (that is, when it is a tunnel barrier layer), $Al_2O_3$, $SiO_2$, MgO, $MgAl_2O_4$, or the like can be used for the material. In addition to these materials, a material in which a part of Al, S1, or Mg is substituted with Zn, Be, or the like can also be used. Of these, since MgO or $MgAl_2O_4$ is a material that can realize coherent tunneling, spin can be efficiently injected. When the non-magnetic spacer layer 240 is made of a metal, Cu, Au, Ag, or the like can be used for the material.

Also, the magnetoresistance effect element part 205 may further include other layers. For example, although not limited to these, an underlayer may be further provided on a surface of the ferromagnetic laminated film 110 on a side opposite to the non-magnetic spacer layer 240. Also, a cap layer may be further provided on a surface of the fixed layer 230 on a side opposite to the non-magnetic spacer layer 240.

<Wiring>

The wiring 250 is electrically connected to the fixed layer 230. For example, in FIG. 10, a closed circuit is formed by the wiring 250, the spin-orbit torque wiring 120, and a power supply (not illustrated), and a current is caused to flow in the lamination direction of the magnetoresistance effect element part 205.

The wiring 250 may be of a highly conductive material and the material is not particularly limited. For example, although not limited to these, aluminum, silver, copper, gold, or the like can be used for the wiring 250.

<Substrate>

The substrate 260 is preferably highly flat. That is, provided that other conditions are the same, one with smaller irregularities is preferable than one with larger irregularities. In order to obtain a highly flat surface, for example, S1, AlTiC, or the like can be used as a material of the substrate 260.

An underlayer (not illustrated) may be formed on a surface of the magnetoresistance effect element part 205 on the spin-orbit torque wiring 120 side. When the underlayer is provided, it is possible to control crystalline properties of each layer laminated on the substrate 260 such as crystal orientation, crystal grain size, or the like.

Various materials can be used for the underlayer. For example, as one example, a nitride layer having a (001)-oriented NaCl structure and containing at least one element selected from the group of Ti, Zr, Nb, V, Hf, Ta, Mo, W, B, Al, and Ce can be used for the underlayer.

As another example, a layer of a (002)-oriented perovskite-based conductive oxide expressed by a composition formula $XYO_3$ can be used for the underlayer. Here, the site X contains at least one element selected from the group of Sr, Ce, Dy, La, K, Ca, Na, Pb, and Ba, and the site Y contains at least one element selected from the group of Ti, V, Cr, Mn, Fe, Co, Ni, Ga, Nb, Mo, Ru, Ir, Ta, Ce, and Pb.

As yet another example, an oxide layer having a (001)-oriented NaCl structure and containing at least one element selected from the group of Mg, Al, and Ce can be used for the underlayer.

As yet another example, a layer having a (001)-oriented tetragonal crystal structure or a cubic crystal structure and containing at least one element selected from the group of Al, Cr, Fe, Co, Rh, Pd, Ag, Ir, Pt, Au, Mo, and W can be used for the underlayer.

Also, the underlayer is not limited to one layer, and may have a plurality of layers in which layers of the above-described examples are laminated. By devising a structure of the underlayer, crystalline properties of each layer can be enhanced, and magnetic characteristics can be improved.

As described above, an additional ferromagnetic metal film such as a Co—Fe—B alloy may be inserted between the ferromagnetic laminated film 110 and the non-magnetic spacer layer 240 to increase a magnetoresistance effect. Further, a non-magnetic insertion layer for cutting off crystal growth of the ferromagnetic laminated film 110 and the additional ferromagnetic metal film may be inserted between ferromagnetic laminated film 110 and additional ferromagnetic metal film. Although not limited to these, the magnetoresistance effect element part 205 may have, for example, a configuration of the ferromagnetic laminated film 110/the non-magnetic insertion layer/the additional ferromagnetic metal film/the non-magnetic spacer layer 240/the fixed layer 230 in order from a side closer to the wiring 250.

Although the magnetoresistance effect element illustrated in the drawing is illustrated as a so-called top pin structure in which the fixed layer 230 is positioned on a side far from the substrate 260 (upper part of the drawing), the structure of the magnetoresistance effect element is not particularly limited and may be a bottom pin structure in which the fixed layer is positioned on a side closer to the substrate (lower part of the drawing).

(Magnetoresistance Effect Element According to Another Embodiment)

In the magnetoresistance effect element including the above-described spin current magnetization rotating element, the ferromagnetic laminated film of the present embodiment was used as a free layer. However, the ferromagnetic laminated film according to the present embodiment can also be used as a fixed layer in the magnetoresistance effect element. Further, it is considered that the magnetoresistance effect element in which the ferromagnetic laminated film of the present embodiment is used as a fixed layer is only by the conventional STT method. On the other hand, the magnetoresistance effect element 200 using the ferromagnetic laminated film of the present embodiment illustrated in FIG. 10 as a free layer can use either the SOT method alone or the STT method and the SOT method in combination.

Figure 11:
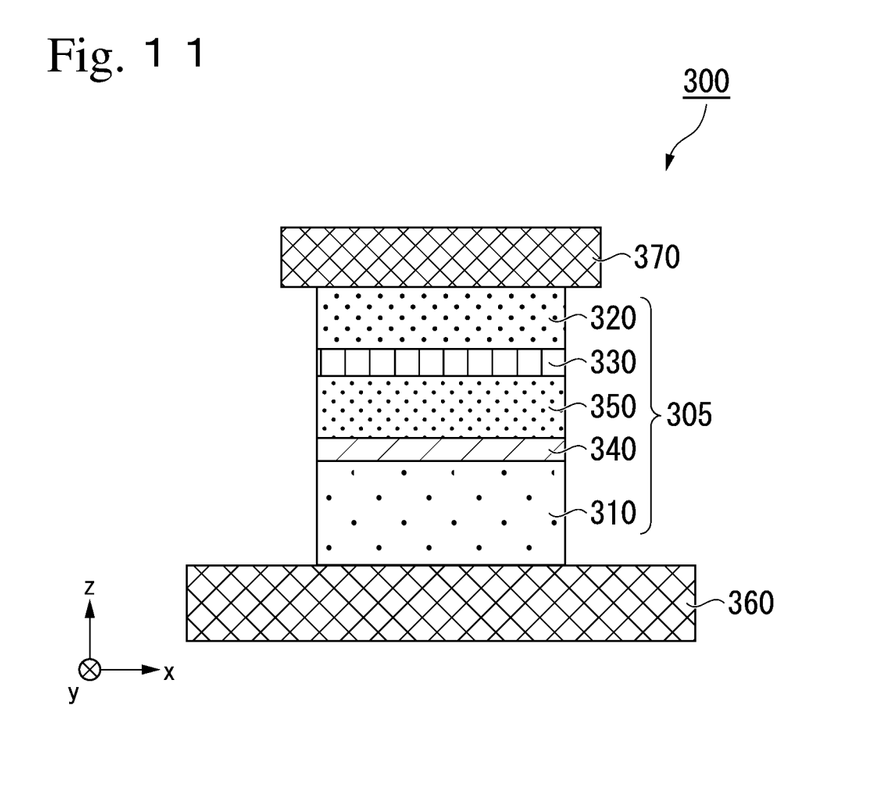
FIG. 11 is a schematic view illustrating an example of a cross-sectional structure of a magnetoresistance effect element according to one embodiment of the present disclosure.

FIG. 11 is a schematic view schematically illustrating an example of a cross-sectional structure of a magnetoresistance effect element 300 when the ferromagnetic laminated film of the present embodiment is used as a fixed layer. FIG. 11 illustrates a bottom pin structure in which the fixed layer is positioned at a lower part of the drawing, but a top pin structure in which the fixed layer is positioned at an upper part of the drawing can also be used.

In the present embodiment, the magnetoresistance effect element 300 includes a ferromagnetic laminated film 310 used as a fixed layer in which a magnetization direction is fixed a free layer 320 in which a magnetization direction changes, and a non-magnetic spacer 330 layer sandwiched between the ferromagnetic laminated film and the fixed layer. The ferromagnetic laminated film 310, the free layer 320, and the non-magnetic spacer layer 330 form a magnetoresistance effect element part 305 together with appropriately added layers.

In FIG. 11, the magnetoresistance effect element part 305 is illustrated as further including an antiferromagnetic coupling layer 340 and an interface ferromagnetic metal layer 350 arbitrarily. Also, a first wiring (lower wiring) 360 electrically connected to the ferromagnetic laminated film 310 and a second wiring (upper wiring) 370 electrically connected to the free layer 320 are illustrated in FIG. 11.

<Ferromagnetic Laminated Film>

The ferromagnetic laminated film 310 is used as a fixed layer in which a magnetization is fixed. The ferromagnetic laminated film 310 is the ferromagnetic laminated film according to the above-described embodiment. That is, the ferromagnetic laminated film 310 may be, for example, any of the ferromagnetic laminated films 10 to 16 illustrated in FIGS. 1 to 7, may be the ferromagnetic laminated film 10 illustrated in FIG. 1, and may be the ferromagnetic laminated film 11 illustrated in FIG. 2. As described above, when the magnetoresistance effect element is applied to a coercivity-differed type (pseudo spin valve type) MRAM, a coercivity of the fixed layer is larger than a coercivity of the free layer. Here, the ferromagnetic laminated film 310 used as the fixed layer has both high magnetic anisotropy and high saturation magnetization. Also, the ferromagnetic laminated film 310 used as the fixed layer is excellent in coercivity, and furthermore, excellent in thermal stability.

Also for the magnetoresistance effect element including the ferromagnetic laminated film of the present embodiment as the fixed layer, a configuration of a known magnetoresistance effect element can be used. For example, each layer other than the ferromagnetic laminated film 310 may also use a configuration in which a plurality of layers are formed.

The ferromagnetic laminated film 310 used as the fixed layer is preferably a perpendicular magnetization film having a magnetization perpendicular to the film surface. Therefore, the free layer 320 also is configured as a perpendicular magnetization film in which a magnetization direction is perpendicular to the layer. When the magnetization of the ferromagnetic laminated film 310 used as the fixed layer is a perpendicular magnetization, since there is no need to use a pinning layer in which an antiferromagnetic material is used, it is preferable because it can withstand heat treatment at 350° C. or higher and a high magnetoresistance effect can be obtained.

Further, it is also preferable that a magnetization direction of the ferromagnetic laminated film 310 be inclined with respect to the film lamination direction. When a direction of the magnetization of the ferromagnetic laminated film 310 used as the fixed layer of the SOT is inclined with respect to the film laminating direction, a leakage magnetic field from the ferromagnetic laminated film 310 to the free layer 320 is inclined, and magnetization reversal in the absence of a magnetic field can be performed.

As a material of the free layer 320, a ferromagnetic material can be used. Also, as a material of the free layer 320, particularly a soft magnetic material can be suitably applied. As the material of the free layer, for example, although not limited to these, a metal selected from the group consisting of Cr, Mn, Co, Fe, and Ni, an alloy containing one or more of these metals, an alloy containing these metals and at least one element of B, C, and N, or the like can be used. Of the materials described above, Co—Fe, Co—Fe—B, and Ni—Fe can be exemplified as the free layer 320, and Co—Fe—B is particularly preferable.

A material of the non-magnetic spacer layer 330 is the same as the material of the non-magnetic spacer layer 240 described above. The material of the non-magnetic spacer layer 330 is preferably, for example, MgO.

The magnetoresistance effect element part 305 may further include the antiferromagnetic coupling layer 340 and the interface ferromagnetic metal layer 350 to form a synthetic antiferromagnetic (SAF) structure. In such an SAF structure, the ferromagnetic laminated film 310 and the interface ferromagnetic metal layer 350 are antiferromagnetically coupled by an RKKY interaction via the antiferromagnetic coupling layer 340, and magnetization directions of these two ferromagnetic materials are anti-parallel to each other.

The antiferromagnetic coupling layer 340 is a non-magnetic layer. A material forming the antiferromagnetic coupling layer may be, for example, a non-magnetic metal such as Ru, Rh or Jr.

The interface ferromagnetic metal layer 350 is a ferromagnetic layer and is also called a reference layer. A material forming the interface ferromagnetic metal layer 350 may be the same as the material forming the free layer 320. The material forming the interface ferromagnetic layer 350 is preferably Co—Fe—B.

The first wiring (lower wiring) 360 is electrically connected to the ferromagnetic laminated film 310. The second wiring (upper wiring) 370 is electrically connected to free layer 320. In FIG. 11, a closed circuit is formed by the first wiring 360, the second wiring 370, and the power supply (not illustrated), and a current is caused to flow in the lamination direction of the magnetoresistance effect element 305.

The material of the first wiring 360 is not particularly limited as long as it is a highly conductive material. For example, aluminum, silver, copper, gold, or the like may be used for the first wiring 360.

The material of the second wiring 370 is also not particularly limited as long as it is a highly conductive material. The same material as that of the first wiring 360 can be used for the second wiring 370, and the material of the first wiring 360 and the material of the second wiring 370 may be the same. When the material of the first wiring 360 and the material of the second wiring 370 are the same, the magnetoresistance effect element 300 performs magnetization reversal using, for example, only the conventional STT method. As an alternative embodiment, the second wiring 370 may be configured as the spin-orbit torque wiring as described above, and magnetization reversal by the SOT method may be used in the magnetoresistance effect element 300.

(Method of Manufacturing Ferromagnetic Laminated Film)

A method of manufacturing the ferromagnetic laminated film of the present embodiment is not particularly limited, and a known film forming method can be used. For example, physical vapor deposition (PVD) methods such as resistance heating deposition, electron beam evaporation, a molecular beam epitaxy (MBE) method, an ion plating method, an ion beam deposition method, or a sputtering method can be used as the film forming method. Alternatively, chemical vapor deposition (CVD) methods such as a thermal CVD method, a photo CVD method, a plasma CVD method, a metal-organic chemical vapor deposition (MOCVD) method, or an atomic layer deposition (ALD) method can also be used.

It is preferable to perform annealing treatment on the obtained ferromagnetic laminated film. A layer formed by reactive sputtering is amorphous and needs to be crystallized.

The ferromagnetic laminated film manufactured by annealing treatment has an improved magnetoresistance ratio compared to a ferromagnetic laminated film manufactured without annealing treatment.

As the annealing treatment, it is preferable that heating be performed in an inert atmosphere such as Ar at a temperature of 300° C. or more and 500° C. or less for 5 minutes or more and 100 minutes or less, and then heating be performed in a state in which a magnetic field of 2 kOe or more and 10 kOe or less is applied at a temperature of 100° C. or more and 500° C. or less for 1 hour or more and 10 hours or less.

As a method of forming the ferromagnetic laminated film into a predetermined shape, although not particularly limited, a processing means such as photolithography can be used. First, the ferromagnetic laminated film is laminated, and then a resist is applied thereon. Then, a predetermined portion of the resist is cured and unnecessary portions of the resist is removed. The portion in which the resist has been cured serves as a protective film for the ferromagnetic laminated film. The portion in which the resist has been cured has the same shape as that of a finally obtained ferromagnetic laminated film.

Then, a process such as ion milling, reactive ion etching (RIE), or the like is performed on a surface on which the protective film is formed. A portion in which the protective film is not formed is removed, and thereby the ferromagnetic laminated film with a predetermined shape is obtained.

The present disclosure is not necessarily limited to the configurations and manufacturing methods according to the above-described embodiments, various modifications can be added without departing from the gist of the present disclosure, and various embodiments may be implemented in combination.

(Magnetic Memory)

A magnetic memory (MRAM) of the present embodiment includes a plurality of magnetoresistance effect elements of the present embodiment.

REFERENCE SIGNS LIST

1: First magnetic layer
2: Second magnetic layer

3: First non-magnetic layer
4: Third magnetic layer
10, 11, 12, 13, 14, 15, 16, 110, 310: Ferromagnetic laminated film
100: Spin current magnetization rotating element
120: Spin-orbit torque wiring
130: Power supply
200, 300: Magnetoresistance effect element
205, 305: Magnetoresistance effect element part
230: Fixed layer
240, 330: Non-magnetic spacer layer
250: Wiring
260: Substrate
320: Free layer
340: Antiferromagnetic coupling layer
350: Interface ferromagnetic metal layer
360: First wiring
370: Second wiring

The invention claimed is:

1. A ferromagnetic laminated film comprising:
a plurality of first magnetic layers;
at least one second magnetic layer; and
at least one first non-magnetic layer, wherein
the first magnetic layers are alternately laminated with the second magnetic layer or the first non-magnetic layer, and a material forming the first magnetic layers is different from a material forming the second magnetic layer,
the first magnetic layers, the first non-magnetic layer, and the second magnetic layer are a material combination in which interface magnetic anisotropy is generated between the first magnetic layer and the first non-magnetic layer, and a material combination in which interface magnetic anisotropy is generated between the first magnetic layer and the second magnetic layer,
at least one of the plurality of first magnetic layers is directly joined to the at least one first non-magnetic layer to form a first interface portion; and
at least one of the plurality of first magnetic layers is directly joined to the at least one second magnetic layer to form a second interface portion.

2. The ferromagnetic laminated film according to claim 1, wherein
the first magnetic layers are formed of a ferromagnetic material containing one or both of Co and Fe,
the second magnetic layer is formed of a ferromagnetic material containing Ni, and
the first non-magnetic layer is formed of a non-magnetic material containing at least one of V, Cr, Mo, Ta and W.

3. The ferromagnetic laminated film according to claim 1, wherein
the first magnetic layers are formed of a ferromagnetic material containing one or both of Co and Fe,
the second magnetic layer is formed of a ferromagnetic material containing Ni, and
the first non-magnetic layer is formed of a non-magnetic material containing at least one of Ti, Zr, Hf, Ru, Rh, Pd, Ag, Ir, Pt, and Au.

4. The ferromagnetic laminated film according to claim 1, wherein at least one of the first non-magnetic layers is thicker than any of the plurality of first magnetic layers and the at least one second magnetic layer.

5. The ferromagnetic laminated film according to claim 1, wherein a lamination order in which the first magnetic layers are alternately laminated with the second magnetic layer or the first non-magnetic layer is a lamination order that is asymmetric with respect to a first direction perpendicular to a film surface of the ferromagnetic laminated film.

6. The ferromagnetic laminated film according to claim 5, comprising at least one asymmetric five-layer structure in which the first magnetic layer, the second magnetic layer, the first magnetic layer, the first non-magnetic layer, and the first magnetic layer are laminated in order in the first direction.

7. A magnetoresistance effect element comprising:
the ferromagnetic laminated film according to claim 1 as a fixed layer in which a magnetization direction is fixed,
the magnetoresistance effect element further comprising:
a free layer; and
a non-magnetic spacer layer sandwiched between the ferromagnetic laminated film and the free layer.

8. The magnetoresistance effect element according to claim 7, further comprising an antiferromagnetic coupling layer and an interface ferromagnetic metal layer between the ferromagnetic laminated film and the non-magnetic spacer layer.

9. The magnetoresistance effect element according to claim 8, wherein the antiferromagnetic coupling layer contains Ru, Rh, or Ir.

10. A spin current magnetization rotating element comprising:
the ferromagnetic laminated film according to claim 1; and
a spin-orbit torque wiring extending in a second direction intersecting a first direction perpendicular to a film surface of the ferromagnetic laminated film and positioned in the first direction from the ferromagnetic laminated film.

11. The spin current magnetization rotating element according to claim 10, wherein the spin-orbit torque wiring is in contact with the ferromagnetic laminated film in the first direction.

12. A magnetoresistance effect element comprising:
the spin current magnetization rotating element according to claim 10;
a fixed layer in which a magnetization direction is fixed; and
a non-magnetic spacer layer sandwiched between the ferromagnetic laminated film and the fixed layer.

13. The magnetoresistance effect element according to claim 12, wherein a magnetization of the ferromagnetic laminated film is inclined with respect to a lamination direction.

14. The magnetoresistance effect element according to claim 12, wherein a magnetization of the ferromagnetic laminated film is a perpendicular magnetization.

15. A magnetic memory comprising a plurality of magnetoresistance effect elements according to claim 12.

* * * * *